April 8, 1952 R. P. MOORE, JR., ET AL 2,591,961

TRANSISTOR RING COUNTER

Filed Nov. 28, 1950 2 SHEETS—SHEET 1

INVENTORS
Raymond P. Moore, Jr.
& Everett Eberhard
BY H. O. Newton
ATTORNEY

INVENTORS
Raymond P. Moore, Jr.
& Everett Eberhard
BY H. L. Newton
ATTORNEY

Patented Apr. 8, 1952

2,591,961

UNITED STATES PATENT OFFICE 2,591,961

TRANSISTOR RING COUNTER

Raymond P. Moore, Jr., Haddonfield, N. J., and Everett Eberhard, Phoenix, Ariz., assignors to Radio Corporation of America, a corporation of Delaware Application November 28, 1950, Serial No. 197,986

12 Claims. (Cl. 171—97)

This invention relates generally to counter circuits, and more particularly relates to a ring counter employing semi-conductor devices as counting elements.

A conventional ring counter may comprise a plurality of stages, each including a pair of triode vacuum tubes. (See, for example, British Patent 572,884 of 1942, or pages 122–125 of the March, 1948 issue of "Electronics.") The individual counter stages are connected in a closed loop and the input or trigger pulses are impressed simultaneously on all the stages. One of the stages is triggered by the input pulses into its conducting state while the previously conducting stage is simultaneously triggered into a non-conducting state. An output pulse may be derived from one of the counter stages, and the output pulses have a frequency which equals that of the trigger pulses divided by the number of stages. A ring counter may accordingly be considered as a frequency divider.

It is also feasible to provide a ring counter wherein each stage is provided with a single triode. In such a counter circuit, the number of possible stages cannot exceed five because the counter would become unstable if more stages were provided. Other ring counters have a thyratron in each stage. However, the frequency of the input pulses is limited by the fact that the thyratron has a finite ionization time which determines how often it can be triggered. Finally, a conventional ring counter may have a pentode in each stage. In all conventional ring counters including vacuum or gas discharge tubes it may be said that each stage is either conducting or non-conducting. If each stage has two tubes, then one of the tubes will be conducting while the other one will be cut off. Thus, each tube has two states of current conduction, that is, they are either fully conducting or they are non-conducting.

In accordance with the present invention, a ring counter is provided where each stage consists of a single semi-conductor device, such as a transistor.

It is accordingly an object of the present invention to provide a novel ring counter employing a plurality of stages, each including a single semi-conductor device which will operate over a wide frequency range of the trigger or input pulses.

Another object of the invention is to provide a novel ring counter of the character described wherein each counter stage consists essentially of a semi-conductor device and which requires less space, less power and is more readily portable than conventional ring counters.

A further object of the invention is to provide a novel transistor ring counter which requires a minimum of circuit components and which is stable in operation.

A ring counter in accordance with the present invention comprises a plurality of counter stages connected in a closed loop. Each stage consists of a transistor which has a high, a low and an intermediate state of current conduction which may be called respectively, the non-indicating, the primed and the indicating condition. An impedance element, such as a resistor is connected between each base electrode and ground to provide internal feedback. The trigger pulses, that is, the pulses to be counted are applied simultaneously between two electrodes of each stage such as between the emitter and base electrodes. Between each counter stage and its succeeding stage there is provided a priming circuit connection or priming means which may, for example, be connected between the collector electrodes of a stage and the emitter electrode of a succeeding stage. This priming connection will transfer the succeeding stage into its state of intermediate current conduction or primed condition when the preceding stage is triggered by a trigger pulse into its state of high conduction or indicating condition. In this manner, the succeeding stage is primed or conditioned to be triggered by the next trigger pulse into its state of high current conduction.

Furthermore, means are provided for triggering a preceding stage from its state of high conduction into its state of low conduction or its non-indicating condition when a succeeding stage is triggered into its state of high conduction by a trigger pulse. This may, for example, be accomplished by the trigger pulses which may have a trailing edge of a polarity opposite to that of the leading edge. Alternatively, a feedback connection may be provided between the collector electrode of a stage and the base electrode of the preceding stage.

Accordingly, a trigger pulse applied to a primed stage will trigger that stage into high current conduction. Simultaneously, the stage which previously was in a state of high conduction will be triggered into low conduction. At the same time, a succeeding stage will be primed or transferred into the primed condition so that it can be triggered into high conduction by the succeeding trigger pulses.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings in which:

Figure 1:
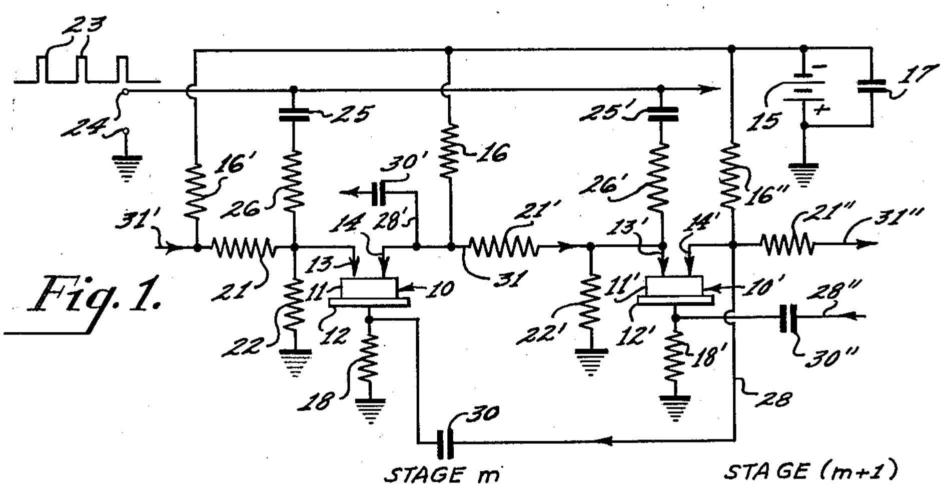
Figure 1 is a circuit diagram of a ring counter including two stages and embodying the present invention.

Referring now to the drawings, in which like components have been designated by the same reference numerals throughout the figures, and particularly to Figure 1 there is illustrated a two stage ring counter comprising two stages each of which includes a semi-conductor device 10 and 10'. The first counter stage has been labeled stage $m$ and the second has been labeled stage $(m+1)$ in Figure 1. Since the two stages $m$ and $m+1$ are identical, only one stage will be described and corresponding components of the second stage are designated by primed reference numerals. It will be understood that more than two stages may be provided which may be connected in the same manner.

Semi-conductor device 10 includes a semi-conducting body 11 which may, for example, consist of a semi-conducting crystal such as silicon or preferably germanium. As is well known, the semi-conducting body may either be of the P type or of the N type. For the following discussion it will be assumed that body 11 is of the N type. Base electrode 12, emitter electrode 13 and collector electrode 14 are provided in contact with body 11. Base electrode 12 is in low-resistance contact with body 11 to determine the potential of the bulk of crystal 11. Base electrode 12 may, for example, consist of a large area electrode which is preferably soldered to crystal 11. Emitter 13 and collector 14 are in rectifying contact with crystal 11. They may consist of point electrodes or line electrodes, which are in small area contact with crystal 11 although it is possible to utilize large area electrodes provided they are in rectifying contact with crystal 11.

A voltage in the forward direction is impressed between emitter 13 and base 12 as is conventional. If body 11 is of the N type, emitter 13 should be positive with respect to base 12. Similarly a voltage in the reverse direction is impressed between collector 14 and base 12. If it is again assumed that body 11 is of the N type, collector 14 should be negative with respect to base 12. If body 11 should be of the P type, the polarity of the voltages impressed on emitter 13 and collector 14 should be reversed. For the purpose of impressing these voltages, there may be provided a battery shown at 15 having its positive terminal grounded while its negative terminal is connected to collector 14 through resistor 16. Battery 15 may be bypassed for alternating frequency currents by capacitor 17.

A resistor 18 is provided between base 12 and ground. Accordingly a portion of the collector current will flow through base resistor 18, thereby maintaining base electrode 12 at a potential that is negative with respect to ground. Accordingly, a small negative voltage should be impressed on emitter 13 to maintain the emitter at a small positive voltage with respect to the base 12. This may, for example, be effected by a voltage divider network including resistors 16', 21, and 22 connected between the negative terminal of battery 15 and ground. The junction point between resistors 21 and 22 is connected to emitter 13.

Figure 3:
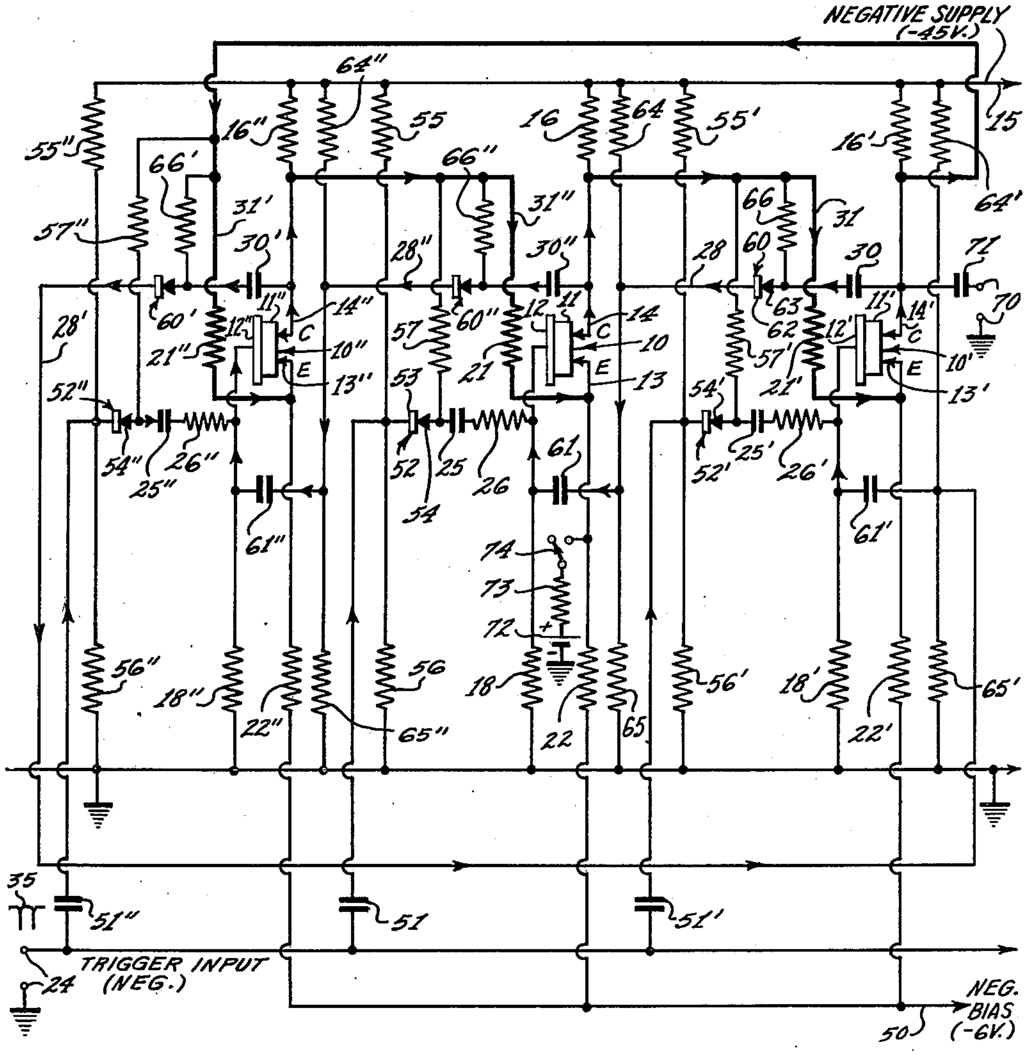
Figure 3 is a circuit diagram of a three stage ring counter modified in accordance with the invention.

Positive trigger pulses, that is, the pulses to be counted, shown at 23 may, for example, be impressed on emitter electrode 13. The trigger pulses 23 are impressed on input terminals 24, one of which is grounded while the other one is connected to emitter electrode 13 through capacitor 25 and resistor 26 connected in series. Capacitor 25 functions as a blocking capacitor which will prevent direct current from battery 15 to reach input terminals 24. Instead of applying positive trigger pulses 23 to emitter 13 it is also feasible to apply negative trigger pulses to base 12 as shown in Figure 3, which will be discussed later. It will be obvious that the same effect is obtained whether the voltage of emitter 13 is raised or whether the voltage of base 12 is lowered. In any case, the effective potential between emitter 13 and base 12 is increased thereby tending to drive the semi-conductor device into a state of higher current conduction.

In accordance with the present invention, a cut-off feedback connection or transfer means indicated at 28 is provided between emitter electrode 14' of stage $m+1$ and base electrode 12 of stage $m$. In other words, the feedback connection is provided between the collector electrode of one stage and the base electrode of a preceding stage, which may be the next or immediately preceding stage. The feedback connection 28 includes capacitor 30, which will prevent battery 15 from being short circuited through resistors 16' and 18. The cut-off feedback connection 28 serves the purpose of triggering the preceding stage such as stage $m$ into its state of low current conduction when the succeeding stage such as stage $m+1$ has been triggered into its state of high current conduction.

It will be understood that a preceding stage may be cut off in any other suitable manner. Thus, for example, the trigger pulses may have a trailing edge of a polarity opposite to that of the leading edge so that the trailing edge cuts off the stage which has previously been brought into its state of high current conduction by the preceding trigger pulse.

Further in accordance with the present invention there is provided a priming circuit connection 31 whcih is provided between collector electrode 14 of stage $m$ and emitter electrode 13' of stage $m+1$. The priming circuit connection 31 accordingly is provided between each stage, such as stage $m$ and a succeeding stage, such as stage $m+1$ for transferring the succeeding stage into its primed condition or its state of intermediate current conduction, when stage $m$ is triggered by a pulse into its state of high current conduction. In this manner, stage $m+1$ is primed or conditioned to be triggered by the succeeding trigger pulse into its state of high current conduction.

The priming circuit connection 31 includes resistor 21' which is connected between collector 14 of stage $m$ and emitter 13' of stage $m+1$. It will be understood that resistor 21' forms part of the voltage divider including resistor 16, 21' and 22' which normally maintain emitter 13' at a predetermined voltage.

Resistor 21'' is connected to collector electrode 14' and may have its free terminal connected to the emitter electrode of a succeeding stage to form the priming circuit connection. Capacitor 30'' has one terminal connected to base electrode 12' and its other terminal may be connected to the collector electrode of a succeeding stage to form the cut-off feedback connection 28'' for the next stage. In a similar manner, the lead shown at 31' and connected to the junction point between resistors 20 and 21 may be connected to the collector electrode of a stage preceding stage $m$. Furthermore, capacitor 30' is connected to collector 14 and may be connected to the base electrode of a stage preceding stage $m$ to form the cut-off feedback connection 28'.

Accordingly, if the ring counter consists of only two stages, leads 28' and 28'' should be connected and one of the capacitors 30' or 30'' may be omitted. This connection will be the cut-off feedback connection. Similarly, leads 31' and 31'' should be connected, and one of the resistors 21 or 21'' omitted to form the priming circuit connection.

Figure 2:
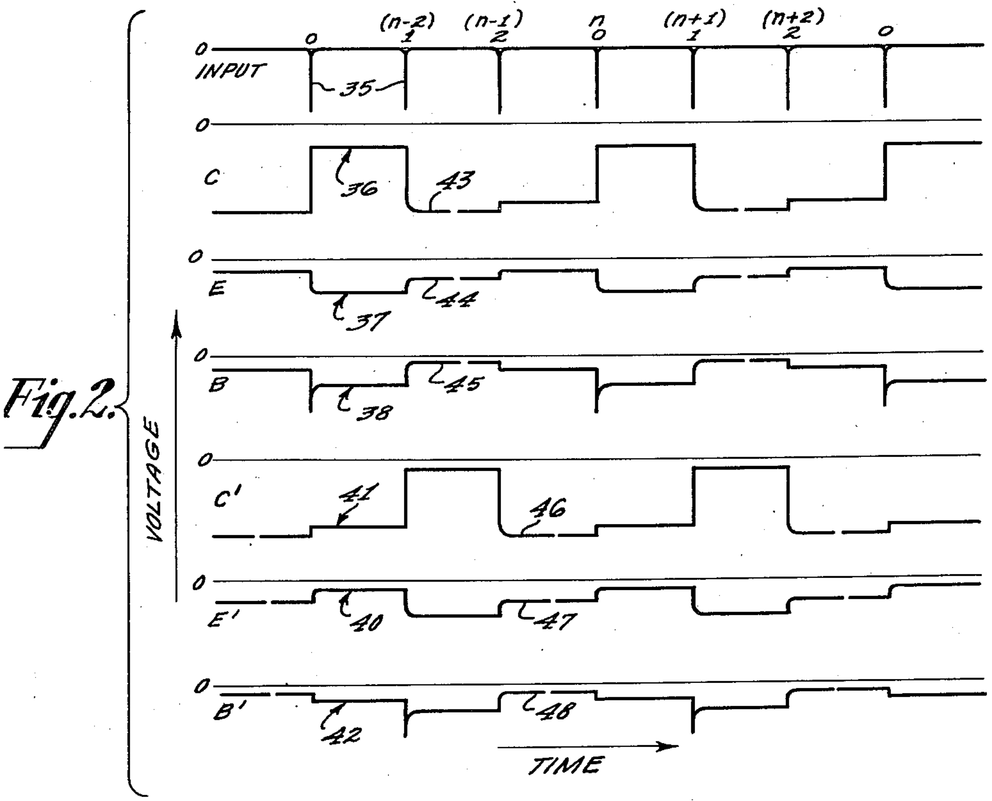
Figure 2 is a graph illustrating the voltages existing at the electrodes of the two stages of the counter of Figure 1 plotted with respect to time.

The operation of the circuit of Figure 1 will now be explained by reference to Figure 2. In Figure 2 the symbols C, E and B indicate respectively collector electrode 14, emitter electrode 13, and base electrode 12 of stage $m$. Similarly, the symbols C', E' and B' indicate respectively collector electrode 14', emitter electrode 13' and base electrode 12' of stage $m+1$. Negative input pulses 35 are shown in Figure 2, and it will be understood that such negative input or trigger pulses should be applied to the base electrodes. Consecutively, input pulses have been labeled 0, 1, 2, 0, etc. Assuming a three stage ring counter every third trigger pulse such, for example, as pulse 0 will develop an output pulse or signal which may be derived from the collector electrode of one of the stages.

As explained hereinbefore, each counter stage has three distinct states of current conduction, which may be termed the high, the low and the intermediate state of current conduction. A triggered stage is in the state of high current conduction. A succeeding stage is in a state of intermediate current conduction, that is, it is primed to receive the next trigger pulse. The remaining stages are in a state of low current conduction, that is, they may be said to be cut off although they will conduct a certain amount of current.

Let it now be assumed that stage $m$ has just been triggered by the first trigger pulse 0 into its state of high current conduction. Curves 36, 37, and 38 (Figure 2) indicate respectively the voltages at the collector 14, emitter 13 and base 12 of stage $m$. It will be seen that the collector voltage 36 (between trigger pulses 0 and 1) is, close to ground due to the voltage drop across collector resistor 16 caused by the comparatively heavy collector current. At the same time, the base voltage 38 will be low which is again caused by the flow of current through base resistor 18, which drives the base voltage in the negative direction. Due to the fact that the collector voltage of the preceding stage now has a comparatively high negative value and also because some of the collector current returns through the impedance between emitter and ground, the emitter voltage 37 will also have a comparatively high negative value.

The voltage existing at this time (between trigger pulses 0 and 1) at collector electrode 14 is impressed on emitter electrode 13' of stage $m+1$ through the priming circuit connection 31. Since the voltage of collector 14 approaches ground, that is, it becomes less negative, the voltage of emitter electrode 13' will also go in a less negative direction toward ground.

This is shown by curve 40 in Figure 2 indicating the emitter voltage of stage $m+1$. Curves 41 and 42 indicate respectively the collector voltage and the base voltage of stage $m+1$. In view of the fact that the voltage of emitter electrode 13' is now less negative, the current conduction through state $m+1$ will be slightly increased. This results in a less negative collector voltage 41 and in a higher negative base voltage 42.

Let it now be assumed that the succeeding trigger pulse 1 is impressed either on both emitters 13 and 13' or on both bases 12 and 12'. If the trigger pulse 1 is of negative polarity as shown at 35 in Figure 2, it will cause a negative kick on the base voltage 42 of stage $m+1$. This will increase the effective potential between emitter 13' and base 12' and trigger stage $m+1$ which has previously been primed or conditioned for the reception of the next trigger pulse into high current conduction. The voltages 41, 40 and 42 (between trigger pulses 1 and 2) now correspond respectively to the voltages 36, 37, and 38, which did previously exist on stage $m$ before the arrival of trigger pulse 1.

The positive going voltage of collector 14' is fed back through cut-off feedback connection 28 and capacitor 30 to base 12, thereby driving the voltage of base 12 in a positive direction as shown by curve portion 45 of curve 38. This will, of course, trigger stage $m$ into its state of low current conduction due to the small potential now existing between its emitter 13 and its base 12. Accordingly, the voltage of collector 14 will reach a high negative value as shown by curve portion 43 of curve 36, while the emitter voltage illustrated by curve portion 44 of curve 37 will be slightly more positive but not as much so as the base as clearly shown by curve portion 45 of curve 38.

The stage succeeding stage $m+1$ which may be designated with stage $m+2$ is now primed by the priming circuit connection 31'' in the manner previously explained. Upon the arrival of the succeeding trigger pulse, which may be pulse 2, the ring counter operates in the manner just described. In other words, stage $m+2$ will go into high current conduction, stage $m+1$ will be cut off by stage $m+2$, and the next stage, which may be stage $m$ will be primed for the reception of a succeeding trigger pulse. It will be noticed that curves 41, 40 and 42 respectively are shifted with respect to curves 36, 37 and 38 by the time interval between two succeeding trigger pulses.

It will also be observed from the previous explanation that any number of counter stages may be provided. Thus, if more than three counter stages are provided, curve portions 43, 44 and 45 of curves 36, 37, and 38 respectively will extend over more than the time interval between two succeeding trigger pulses as indicated by the gaps between these curve portions. The length of these curve portions 43 to 45 corresponds to the number of stages in excess of three. In a similar manner, curve portions 46, 47 and 48 of curves 41, 40 and 42 respectively are extended over more than the time interval between two successive pulses if more than three stages are provided. From the above explanations the operation of a ring counter of the type illustrated in Figure 1 having more than two counter stages will be perfectly obvious.

For the above description of the operation of the ring counter of the invention, it has been assumed that each semi-conductor device has three distinct states of current conduction, that is, a low, an intermediate, and a high state of current conduction. If semi-conductor devices with sharp cut-off characteristics were available, the ring counter of the invention could be operated in such a manner that only two states of current conduction are obtained. In that case it would only be necessary to set the primed condition or intermediate state of current conduction just below the state of high current conduction or indicating condition so that the next trigger pulse carries the circuit far enough into the high conduction region to produce regeneration. In such a case, both the low-conduction or non-indicating condition and the primed condition or state of current conduction would have the same current flow.

Referring now to Figure 3, there is illustrated a modified ring counter having three stages connected in closed loop. The ring counter of Figure 3 is provided with a pulse gating device such as a rectifier provided in each trigger line, that is between the trigger input and the triggered electrode such as the base electrode of each stage. The pulse gating device is normally in a non-conducting position. Only the pulse gating device connected with a primed stage is rendered conducting so that the succeeding trigger pulse will trigger only that stage. Furthermore, a feedback gating device is provided in the cut-off feedback connection. The feedback gating devices are normally maintained in the non-conducting position. Only one of the feedback gating devices is rendered conducting when its preceding stage has previously been triggered into a state of high current conduction. Accordingly, upon the arrival of the succeeding trigger pulse, only the stage which was previously in high current conduction can be cut off by its succeeding stage.

The three counter stages of Figure 3 comprise three semi-conducting devices 10, 10′ and 10″. The stage in the middle of Figure 3 is provided with the semi-conductor device 10. The stage to the right of device 10 and its circuit components are designated with corresponding reference numerals having prime superscripts while the stage to the left of device 10 and its circuit components have been designated with corresponding reference numerals having double prime superscripts. Base electrode 12 is again grounded through base resistor 18. The collector electrode 14 is connected to a negative source of voltage indicated by arrow 15 through resistor 16. Arrow 15 may, for example, be replaced by battery 15 in Figure 1. Emitter electrode 13 is supplied with a negative bias voltage indicated by arrow 50 through emitter resistor 22. It is, of course, feasible to provide a voltage divider network as shown in Figure 1 to supply the emitter electrode with a suitable bias voltage from battery 15.

Negative trigger pulses indicated at 35 are impressed on input terminals 24. The trigger pulses are impressed on base electrode 12 through a series connection including a capacitor 51, pulse gating device 52 which may be a rectifier and particularly a crystal rectifier as shown, capacitor 25 and resistor 26. Rectifier 52 is illustrated to indicate the easy direction of current flow and includes a cathode 53 and an anode 54. The cathode 53 of rectifier 52 is maintained at a predetermined negative potential. To this end there is provided a voltage divider between the negative voltage supply 15 and ground which includes resistors 55 and 56 having their junction point connected to cathode 53. The anode 54 of rectifier 52 is coupled to the collector electrode 14″ of the previous stage through isolating resistor 57.

Consequently, as long as semi-conducting device 10″ is not in its state of high current conduction, the anode 54 of rectifier 52 will be at such a high negative potential that it is normally maintained in the non-conducting position. However, as will be more fully explained hereinafter, when semi-conductor device 10″ is in its state of high current conduction, the voltage of collector electrode 14″ will be driven in a positive direction so that rectifier 52 is conditioned to transmit or pass the succeeding trigger pulse.

A priming circuit connection 31 shown in heavy lines is again provided between the collector electrode 14 of device 10 and the emitter electrode 13′ of device 10′. The priming circuit connection 31 includes resistor 21′ connected in series between collector 14 and emitter 13′.

A cut-off feedback connection 28 is also provided between collector 14′ of the device 10′ and base 12 of device 10. The cut-off feedback connection 28 includes the series combination of capacitor 30, feedback gating device 60 and capacitor 61. Feedback gating device 60 may, for example, consist of a rectifier such as a crystal rectifier having a cathode 62 and an anode 63. Cathode 62 is also maintained at a predetermined negative potential. To this end there is provided a voltage divider consisting of resistors 64 and 65 connected between the negative voltage supply 15 and ground and having their junction point connected to cathode 62. Furthermore, the anode 63 of the rectifier 60 is coupled to collector electrode 14 through resistor 66.

Accordingly, rectifier 60 is normally maintained in the non-conducting position. However, when device 10 is in its state of high current conduction, the positive going voltage of its collector 14 is impressed through resistor 66 on anode 63 of rectifier 60 thereby rendering it conducting to cut off the device 10 when device 10′ is triggered into high current conduction.

The ring counter of Figure 3 operates substantially in the same manner as that of Figure 1 which has previously been described. Let it again be assumed that semi-conductor device 10 has been triggered into its state of high current conduction. As explained hereinbefore the positive going voltage of its collector electrode 14 is impressed through priming circuit connection 31 including resistor 21′ on emitter electrode 13′ of device 10′. In the manner previously outlined device 10′ is now triggered into its state of intermediate current conduction, that is, it is primed or conditioned to be triggered by the succeeding trigger pulse.

At the same time, the anode 54′ of pulse gating rectifier 52′ becomes more positive, that is, less negative because it is coupled through resistor 57′ to collector electrode 14. Consequently, on the arrival of the succeeding trigger pulse, the pulse will be impressed through capacitor 51′, rectifier 52′, capacitor 25′ and resistor 26′ on base electrode 12′ of device 10′. Thus only rectifier 52′ is conditioned to pass the trigger pulse. The other pulse gating rectifiers 52 and 52″ will block the trigger pulse because their anodes 54 and 54″ are maintained at a high negative potential through collector 14″ and 14′ respectively.

As a result device 10′ is not triggered into its state of high current conduction. At the same time, device 10″ will be primed through the priming connection 31′ and resistor 21″ as previously explained. Furthermore, device 10 will be cut off by impressing the positive going voltage of collector 14′ on base electrode 12. This path, which is the cut-off feedback connection 28, includes capacitor 30, feedback gating rectifier 60 and capacitor 61.

When device 10 is in its state of high conduction while device 10′ is primed, rectifier 60 is also conditioned to be conducting. This is due to the fact that its anode 63 is connected through resistor 66 to collector electrode 14 which has a low negative voltage. It will also be understood that at that time, rectifier 60′ is blocked because its anode is maintained at a negative potential due to its connection to collector 14″ through resistor 66″. Rectifier 60″ is also blocked at this time. Rectifier 60′ will become unblocked as device 10′ goes into its state of high current conduction and device 10″ is primed. Accordingly, device 10″ which is then primed will be conditioned to feed back an impulse through its cut-off feedback connection 28′.

The ring counter of Figure 3 continues to operate in the manner above outlined. Output pulses may be derived from output terminals 70, one of which is grounded while the other one is coupled through capacitor 71 to one of the collector electrodes such as collector 14′. The frequency of the output pulses is that of the input pulses divided by the number of stages which is three in Figure 3.

The ring counter of Figure 3 may be started in the following manner: If all stages are in a state of low current conduction, one of the stages may be put into its state of high current conduction. To this end, a battery 72 may have its negative terminal grounded while its positive terminal may be connected through resistor 73 and a normally open switch 74 to emitter 13. When switch 74 is closed, a positive potential will be impressed on emitter 13 which will cause device 10 to go into its state of high current conduction. When the trigger pulses are now impressed on input terminal 24, the next stage, that is, device 10′ will be triggered into high current conduction and the first positive output pulse will be obtained from output terminals 78.

While it will be understood that the circuit specifications of the ring counter of the invention may vary according to the design for any particular application, the following circuit specifications for the ring counter of Figure 3 are included by way of example only:

| | | |
|---|---|---|
| Voltage of battery 15 | volts | —45 |
| Voltage of battery 50 | do | — 6 |
| Rectifiers 52, 52′, 52″, 60, 60′, 60″ | | 1N34 |
| Collector resistor 16 | ohms | 15,000 |
| Collector resistors 16′, 16″ | do | 10,000 |
| Base resistors 18, 18′, 18″ | do | 8,200 |
| Emitter resistor 22 | do | 1,500 |
| Emitter resistors 22′, 22″ | do | 1,000 |
| Resistors 21, 21″ | do | 12,000 |
| Resistor 21′ | do | 27,000 |
| Resistors 26, 26′, 26″ | do | 10,000 |
| Resistor 57 | do | 180,000 |
| Resistor 57′ | do | 220,000 |
| Resistor 57″ | do | 1,000,000 |
| Resistor 66 | do | 330,000 |
| Resistors 66′, 66″ | do | 390,000 |
| Resistors 55, 55′, 55″ | do | 560,000 |
| Resistor 56 | do | 150,000 |
| Resistors 56′, 56″ | ohms | 100,000 |
| Resistors 64, 64″ | do | 680,000 |
| Resistor 64′ | do | 560,000 |
| Resistor 65 | do | 150,000 |
| Resistors 65′, 65″ | do | 100,000 |
| Capacitors 30, 30′, 30″ micro-microfarads | | 680 |
| Capacitors 25, 25′, 25″ | microfarad | .02 |
| Capacitors 51, 51′, 51″ | do | .02 |
| Capacitors 61, 61′, 61″ | do | .01 |

It will be understood that base resistor 18 serves the purpose of providing operating conditions whereby the semi-conductor devices exhibit negative resistance. Accordingly, it provides for more rapid transition between the various current conduction states of the device. Furthermore, it serves the purpose of locking in the semi-conductor device in any one of its three current conduction states. This action of a semi-conductor device has been disclosed and claimed in a copending application to Eberhard filed on April 30, 1949, Serial No. 90,685, entitled "Flip Flop Counter Circuit," now Patent No. 2,553,001, issued December 5, 1950, and assigned to the assignee of this application. It is feasible as disclosed in the above-identified Eberhard application to provide an impedance element such as a resistor between emitter 13 and collector 14, thereby to improve the stability of the circuit and to facilitate locking in of each device in any one of its three states of conduction.

There has thus been disclosed a ring counter including a single semi-conductor device in each counter stage. The ring counter will count over a wide frequency range of the trigger pulses. Each of the semi-conductor devices is arranged to have three stable conditions or states of current conduction is which it may be locked in. The ring counter circuit of the present invention is comparatively simple and requires few circuit elements.

What is claimed is:

1. A ring counter comprising a plurality of counter stages connected in a closed loop, each of said stages having a non-indicating, a primed and an indicating condition and comprising a semi-conducting body, a base electrode, an emitter electrode and a collector electrode in contact with said body, an impedance element connected between each of said base electrodes and a point of substantially fixed potential, means for applying operating voltages to said electrodes, means for applying trigger pulses simultaneously between two electrodes of each stage, transfer means connected between each stage and a preceding stage for triggering a preceding stage into its non-indicating condition when a succeeding stage is triggered into its indicating condition by one of said trigger pulses, and means connected between each stage and a succeeding stage for transferring a succeeding stage into its primed condition when the preceding stage connected thereto is triggered by one of said trigger pulses into its indicating condition.

2. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, an impedance element connected between each of said base electrodes and a point of substantially fixed potential, means for applying operating voltages to said electrodes, means for applying trigger pulses simultaneously between the emitter and base electrodes of each stage, a transfer feedback connection between each stage and a preceding stage for transferring said preceding stage into its state of low conduction when the stage coupled thereto is triggered into its state of high conduction by one of said trigger pulses, and a priming circuit connection between the collector electrode of each stage and the emitter electrode of a succeeding stage for triggering said succeeding stage into its state of intermediate conduction when the stage connected thereto is triggered by one of said trigger pulses into its state of high conduction, whereby said succeeding stage is primed to be triggered by the next trigger pulse into its state of high current conduction.

3. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, an impedance element connected between each of said base electrodes and a point of substantially fixed potential, means for applying a voltage in the forward direction between each emitter electrode and its associated base electrode and for applying a voltage in the reverse direction between each collector electrode and its associated base electrode, means for applying trigger pulses simultaneously between the emitter and base electrodes of each stage, a cut-off feedback connection between the collector electrode of each stage and the base electrode of a preceding stage for triggering said preceding stage into its state of low conduction when the stage coupled thereto is triggered into its state of high conduction by one of said trigger pulses, and a priming circuit connection between the collector electrode of each stage and the emitter electrode of a succeeding stage for transferring said succeeding stage into its state of intermediate conduction when the stage connected thereto is triggered by one of said trigger pulses into its state of high conduction, whereby said succeeding stage is primed to be triggered by the next trigger pulse into its state of high current conduction.

4. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a resistor connected between each of said base electrodes and a point of substantially fixed potential, means for applying a voltage in the forward direction between each emitter electrode and its associated base electrode and for applying a voltage in the reverse direction between each collector electrode and its associated base electrode, means for applying trigger pulses simultaneously between the emitter and base electrodes of each stage, a cut-off feedback connection between the collector electrode of each stage and the base electrode of the next preceding stage for triggering said preceding stage into its state of low conduction when the stage coupled thereto is triggered into its state of high conduction by one of said trigger pulses, and a priming circuit connection between the collector electrode of each stage and the emitter electrode of the next succeeding stage for transferring said succeeding stage into its state of intermediate conduction when the stage connected thereto is triggered by one of said trigger pulses into its state of high conduction, whereby said succeeding stage is primed to be triggered by the next trigger pulse into its state of high current conduction.

5. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a resistor connected between each of said base electrodes and a point of substantially fixed potential, means for applying a voltage in the forward direction between each emitter electrode and its associated base electrode and for applying a voltage in the reverse direction between each collector electrode and its associated base electrode, an impedance element connected in circuit with each of said emitter electrodes and with each of said collector electrodes, means for applying trigger pulses simultaneously between the emitter and base electrodes of each stage, a cut-off feedback connection including a capacitor connected between the collector electrode of each stage and the base electrode of a preceding stage for triggering said preceding stage into its state of low conduction when the stage coupled thereto by said capacitor is triggered into its state of high conduction by one of said trigger pulses, and a priming circuit connection including a further resistor connected between the collector electrode of each stage and the emitter electrode of a succeeding stage for transferring said succeeding stage into its state of intermediate conduction when the stage connected thereto by said further resistor is triggered by one of said trigger pulses into its state of high conduction, whereby said succeeding stage is primed to be triggered by the next trigger pulse into its state of high current conduction.

6. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a resistor connected between each of said base electrodes and a point of substantially fixed potential, means for applying a voltage in the forward direction between each emitter electrode and its associated base electrode and for applying a voltage in the reverse direction between each collector electrode and its associated base electrode, an impedance element connected in circuit with each of said emitter electrodes and with each of said collector electrodes, means for applying trigger pulses simultaneously between the emitter and base electrodes of each stage including a pulse gating device, means for normally maintaining said pulse gating devices in the non-conducting position, means coupled between each of said pulse gating devices and the stage preceding that associated with one of said pulse gating devices for rendering said pulse gating device conducting when said preceding stage is triggered by one of said trigger pulses into its state of high conduction, a cut-off feedback connection including a capacitor and a feedback gating device connected serially between the collector electrode of each stage and the base electrode of a preceding stage for triggering said preceding stage into its state of low conduction when the stage coupled thereto by said capacitor is triggered into said state of high conduction by one of said trigger pulses, means for normally maintaining said feedback gating device in the non-conducting position, means coupled between each of said feedback gating devices and the preceding stage to which one of said feedback gating devices is connected for rendering said feedback gating device conducting when said preceding stage is triggered into said state of high conduction, and a priming circuit connection including a further resistor connected between the collector electrode of each stage and the emitter electrode of a succeeding stage for transferring said succeeding stage into its state of intermediate conduction when the stage connected thereto by said further resistor is triggered by one of said trigger pulses into its state of high conduction, whereby said succeeding stage is primed to be triggered by the next trigger pulse into its state of high current conduction.

7. A ring counter as defined in claim 6 wherein said gating devices consist of rectifiers.

8. A ring counter as defined in claim 6 wherein said gating devices consist of crystal rectifiers.

9. A ring counter as defined in claim 6 wherein each of said pulse gating devices and each of said feedback gating devices is coupled to the collector electrode of said preceding stage.

10. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a first resistor connected between each of said base electrodes and a point of substantially fixed potential with respect to the remainder of the loop connection, means for applying operating voltages to said electrodes and including a first impedance element connected to each of said emitter electrodes and a second impedance element connected to each of said collector electrodes, means for applying trigger pulses simultaneously to the base electrode of each stage, said last named means including a first rectifier connected to each of said base electrodes, a cut-off feedback connection including a second rectifier connected between the collector electrode of each stage and the base electrode of a preceding stage, thereby providing for triggering said preceding stage into its state of low conduction when the stage coupled thereto by said feedback connection is triggered into its state of high conduction by one of said trigger pulses, said rectifiers having each a cathode and an anode, means for maintaining said cathodes at a fixed predetermined potential with respect to said anodes, means including individual further impedance elements for coupling the anode of each of said rectifiers to the collector electrode of the preceding one of the stage between which said second rectifiers are connected, whereby each of said first rectifiers is conditioned to pass one of said trigger pulses to a stage only when the preceding stage has previously been triggered into said stage of high conduction and whereby each of said second rectifiers is conditioned to cut off a stage when it has previously been triggered into said state of high conduction, and a circuit connection including a second resistor connected between the collector electrode of each stage and the emitter electrode of a succeeding stage for transferring said succeeding stage into its state of intermediate conduction when the stage connected thereto by said second resistor has been triggered by one of said trigger pulses into its state of high conduction, whereby said succeeding stage is conditioned to be triggered by the next trigger pulse into its state of high current conduction.

11. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a first resistor connected between each of said base electrodes and a point of substantially fixed potential, means for applying a voltage in the forward direction between each emitter electrode and its associated base electrode and for applying a voltage in the reverse direction between each collector electrode and its associated base electrode, and including a first impedance element connected to each of said emitter electrodes and a second impedance element connected to each of said collector electrodes, means for applying trigger pulses simultaneously to the base electrode of each stage including a first rectifier connected to each of said base electrodes, a cut-off feedback connection including a second rectifier connected between the collector electrode of each stage and the base electrode of a preceding stage for triggering said preceding stage into its state of low conduction when the stage coupled thereto by said feedback connection is triggered into its state of high conduction by one of said trigger pulses, said rectifiers having each a cathode and an anode, voltage divider means coupled to said means for applying a voltage in the reverse direction for maintaining said cathodes at a fixed predetermined potential with respect to said anodes, means including individual further resistors for coupling the anode of each of said rectifiers to the collector electrode of the preceding one of the stage between which said second rectifiers are connected, whereby each of said first rectifiers is conditioned to transmit one of said trigger pulses to a stage only when the preceding stage has previously been triggered into said state of high conduction and whereby each of said second rectifiers is conditioned to cut off a stage when it has previously been triggered into said state of high conduction, and a circuit connection including a second resistor connected between the collector electrode of each stage and the emitter electrode of a succeeding stage for transferring said succeeding stage into its state of intermediate conduction when the stage connected thereto by said second resistor has been triggered by one of said trigger pulses into its state of high conduction, whereby said succeeding stage is conditioned to be triggered by the next trigger pulse into its state of high current conduction.

12. A ring counter comprising a plurality of counter stages connected in a closed loop, each of said stages having a high, a low and an intermediate state of current conduction and comprising a semi-conducting body, a base electrode, an emitter electrode and a collector electrode in contact with said body, a first resistor connected between each of said base electrodes and a point of substantially fixed potential, a first impedance element connected to each of said emitter electrodes and a second impedance element connected to each of said collector electrodes, means for applying trigger pulses simultaneously to the base electrode of each stage including a first capacitor, a first rectifier, a second capacitor, and a first resistor connected serially to each of said base electrodes, a cut-off feedback connection including a third capacitor, a second rectifier and a fourth capacitor connected in series between the collector electrode of each stage and the base electrode of a preceding stage, said rectifiers having each a cathode and an anode, means for maintaining said cathodes at a fixed predetermined potential with respect to said anodes, means including further individual resistors for coupling the anode of each of said rectifiers to the collector electrode of the preceding one of the stages between which said second rectifiers are connected, and a circuit connection including a third resistor connected between the collector electrode of each stage and the emitter electrode of a succeeding stage.

RAYMOND P. MOORE, Jr.
EVERETT EBERHARD.

No references cited.